United States Patent
Lim et al.

(10) Patent No.: US 9,318,378 B2
(45) Date of Patent: Apr. 19, 2016

(54) SLOT DESIGNS IN WIDE METAL LINES

(75) Inventors: Yeow Kheng Lim, Singapore (SG); Alex See, Singapore (SG); Tae Jong Lee, Singapore (SG); David Vigar, Singapore (SG); Liang Choo Hsia, Singapore (SG); Kin Leong Pey, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 1821 days.

(21) Appl. No.: 10/923,123

(22) Filed: Aug. 21, 2004

(65) Prior Publication Data

US 2006/0040491 A1    Feb. 23, 2006

(51) Int. Cl.
| H01L 21/76 | (2006.01) |
| H01L 21/768 | (2006.01) |
| H01L 23/522 | (2006.01) |
| H01L 23/528 | (2006.01) |
| H01L 23/532 | (2006.01) |

(52) U.S. Cl.
CPC .... *H01L 21/76816* (2013.01); *H01L 21/76802* (2013.01); *H01L 21/76808* (2013.01); *H01L 23/528* (2013.01); *H01L 23/5226* (2013.01); *H01L 23/53295* (2013.01); *H01L 2924/0002* (2013.01)

(58) Field of Classification Search
CPC .................................. H01L 21/76808
USPC ........................................ 438/622
See application file for complete search history.

(56) References Cited

U.S. PATENT DOCUMENTS

| 4,579,812 | A | * | 4/1986 | Bower ........................ 430/313 |
| 5,439,731 | A | * | 8/1995 | Li ....................... H01L 23/5283 |
| | | | | 174/126.2 |
| 5,654,245 | A | * | 8/1997 | Allen ............................ 438/629 |
| 5,670,425 | A | * | 9/1997 | Schinella et al. ............. 438/645 |
| 5,674,787 | A | * | 10/1997 | Zhao et al. .................... 438/627 |
| 5,696,030 | A | | 12/1997 | Cronin |
| 5,831,283 | A | * | 11/1998 | Batey et al. ..................... 257/66 |
| 5,959,360 | A | | 9/1999 | Fu |
| 6,051,859 | A | * | 4/2000 | Hosotani et al. .............. 257/306 |
| 6,121,145 | A | * | 9/2000 | Huang ........................... 438/692 |
| 6,251,710 | B1 | * | 6/2001 | Radens ............... H01L 23/5252 |
| | | | | 257/E23.147 |
| 6,261,960 | B1 | * | 7/2001 | Yu et al. ........................ 438/692 |
| 6,287,968 | B1 | * | 9/2001 | Yu et al. ........................ 438/675 |

(Continued)

OTHER PUBLICATIONS

Lim et al.; Stress-induced Voiding beneath Vias with Wide Copper Metal Leads; Pub. Date not shown; 4 pages.

(Continued)

*Primary Examiner* — Jerome Jackson, Jr.
*Assistant Examiner* — Ankush Singal
(74) *Attorney, Agent, or Firm* — Horizon IP Pte. Ltd.

(57) ABSTRACT

A method and structure for slots in wide lines to reduce stress. An example embodiment method and structure for is an interconnect structure comprising: interconnect comprising a wide line. The wide line has a first slot. The first slot is spaced a first distance from a via plug so that the first slot relieves stress on the wide line and the via plug. The via plug can contact the wide line from above or below. Another example embodiment is a dual damascene interconnect structure comprising: an dual damascene shaped interconnect comprising a via plug, a first slot and a wide line. The wide line has the first slot. The first slot is spaced a first distance from the via plug so that the first slot relieves stress on the wide line and the via plug.

18 Claims, 18 Drawing Sheets

(56) References Cited

U.S. PATENT DOCUMENTS

| | | | |
|---|---|---|---|
| 6,297,554 B1 * | 10/2001 | Lin | 257/752 |
| 6,346,749 B1 * | 2/2002 | Umemura | 257/774 |
| 6,373,136 B2 * | 4/2002 | Otsuka et al. | 257/758 |
| 6,391,766 B1 | 5/2002 | Wang et al. | |
| 6,413,815 B1 * | 7/2002 | Lai et al. | 438/243 |
| 6,489,684 B1 | 12/2002 | Chen et al. | |
| 6,506,680 B1 * | 1/2003 | Kim et al. | 438/692 |
| 6,528,883 B1 | 3/2003 | Dunham et al. | |
| 6,551,856 B1 * | 4/2003 | Lee | 438/108 |
| 6,596,579 B1 * | 7/2003 | Randazzo et al. | 438/253 |
| 6,603,206 B2 * | 8/2003 | Wang et al. | 257/774 |
| 6,727,590 B2 * | 4/2004 | Izumitani et al. | 257/758 |
| 6,794,262 B2 * | 9/2004 | Ning et al. | 438/396 |
| 6,870,265 B2 * | 3/2005 | Kurimoto et al. | 257/758 |
| 6,898,851 B2 * | 5/2005 | Nishioka et al. | 29/852 |
| 6,911,389 B2 * | 6/2005 | Brennan et al. | 438/622 |
| 6,914,319 B2 * | 7/2005 | Okada | 257/529 |
| 6,924,206 B2 * | 8/2005 | Ozawa | 438/387 |
| 6,927,160 B1 * | 8/2005 | Kitch | 438/631 |
| 6,943,080 B2 * | 9/2005 | Maruyama | 438/239 |
| 6,998,712 B2 * | 2/2006 | Okada et al. | 257/758 |
| 7,023,091 B2 * | 4/2006 | Funakoshi et al. | 257/758 |
| 7,030,016 B2 * | 4/2006 | Feng et al. | 438/687 |
| 7,042,097 B2 * | 5/2006 | Yao et al. | 257/774 |
| 7,060,557 B1 * | 6/2006 | Zhao et al. | 438/253 |
| 7,071,054 B2 * | 7/2006 | Park | 438/243 |
| 7,147,766 B2 * | 12/2006 | Uzoh et al. | 205/118 |
| 7,170,144 B2 * | 1/2007 | Hsu | 257/499 |
| 7,199,474 B2 * | 4/2007 | Buchanan et al. | 257/760 |
| 7,208,837 B2 * | 4/2007 | Wang et al. | 257/758 |
| 7,301,107 B2 * | 11/2007 | Karthikeyan et al. | 174/262 |
| 2002/0000668 A1 * | 1/2002 | Sakihama et al. | 257/758 |
| 2002/0004259 A1 * | 1/2002 | Liu et al. | 438/118 |
| 2002/0005583 A1 * | 1/2002 | Harada et al. | 257/758 |
| 2002/0038903 A1 * | 4/2002 | Tsau | 257/532 |
| 2002/0100983 A1 * | 8/2002 | Clevenger | H01L 21/76843 257/774 |
| 2002/0125577 A1 * | 9/2002 | Komada | 257/774 |
| 2002/0175415 A1 * | 11/2002 | Matsunaga | 257/758 |
| 2002/0192938 A1 * | 12/2002 | Wada et al. | 438/618 |
| 2003/0080428 A1 * | 5/2003 | Izumitani et al. | 257/758 |
| 2003/0100190 A1 * | 5/2003 | Cote et al. | 438/710 |
| 2003/0162354 A1 * | 8/2003 | Hashimoto et al. | 438/257 |
| 2003/0201484 A1 * | 10/2003 | Ozawa | 257/306 |
| 2003/0228714 A1 | 12/2003 | Smith et al. | |
| 2004/0070078 A1 * | 4/2004 | Ho et al. | 257/774 |
| 2004/0077175 A1 * | 4/2004 | Hsieh et al. | 438/694 |
| 2004/0108592 A1 * | 6/2004 | Cheng et al. | 257/734 |
| 2004/0113238 A1 * | 6/2004 | Hasunuma | H01L 21/76832 257/636 |
| 2004/0150070 A1 * | 8/2004 | Okada et al. | 257/508 |
| 2004/0217480 A1 * | 11/2004 | Clevenger et al. | 257/758 |
| 2004/0238964 A1 * | 12/2004 | Kawano et al. | 257/758 |
| 2004/0245639 A1 * | 12/2004 | Yao et al. | 257/758 |
| 2004/0245643 A1 * | 12/2004 | Takewaki et al. | 257/758 |
| 2004/0255259 A1 * | 12/2004 | Tan et al. | 716/11 |
| 2004/0262770 A1 * | 12/2004 | Ozawa | 257/758 |
| 2005/0082677 A1 * | 4/2005 | Fan et al. | 257/774 |
| 2005/0245082 A1 * | 11/2005 | Perng et al. | 438/687 |
| 2005/0255695 A1 * | 11/2005 | Shimada | 438/637 |
| 2006/0001170 A1 * | 1/2006 | Zhang et al. | 257/762 |
| 2006/0216926 A1 * | 9/2006 | Ye et al. | 438/629 |
| 2008/0042268 A1 * | 2/2008 | Yu et al. | 257/734 |

OTHER PUBLICATIONS

Doong et al.; Stress-Induced Voiding and Its Geometry Dependancy Characterization; Pub. Date not shown; 5 pages.
Yoshida et al.; Stress-Induced Voiding Phenomena for an actual CMOS LSI Interconnects; 2002; IEEE; 4 pages.
Oshima et al.; Suppression of Stress-Induced Voiding in Copper Interconnects; 2002; IEEE; 4 pages.
Ogawa et al.; Stress-Induced Voiding Under Vias Connected to Wide Cu Metal Leads; 2002; IEEE; 10 pages—312 to 321.
Oshima et al.; Improvement of Thermal Stability of Via Resistance in Dual Damascene Copper Interconnection; 2000; IEEE; 4 pages.
Lim et al.; Stress-Induced Voiding in Multi-Level Copper/Low-k Interconnects; Pub. Date not shown; 6 pages.

* cited by examiner

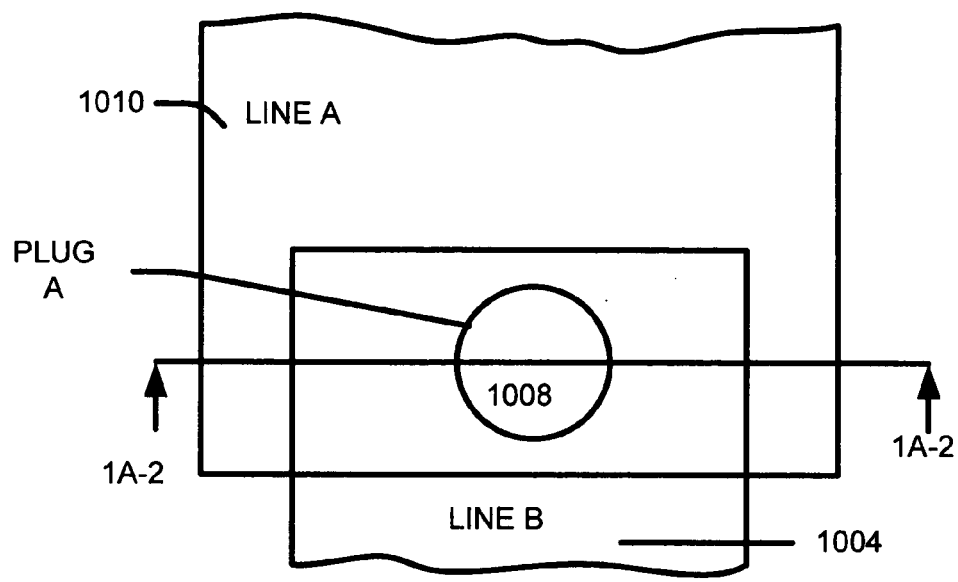
FIGURE 1A-1
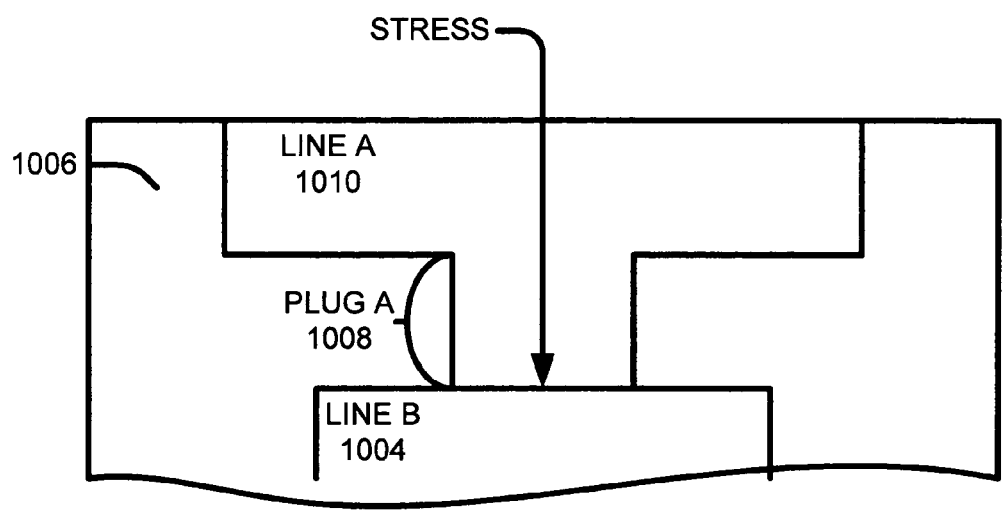
FIGURE 1A-2     TYPE 1 STRUCTURE

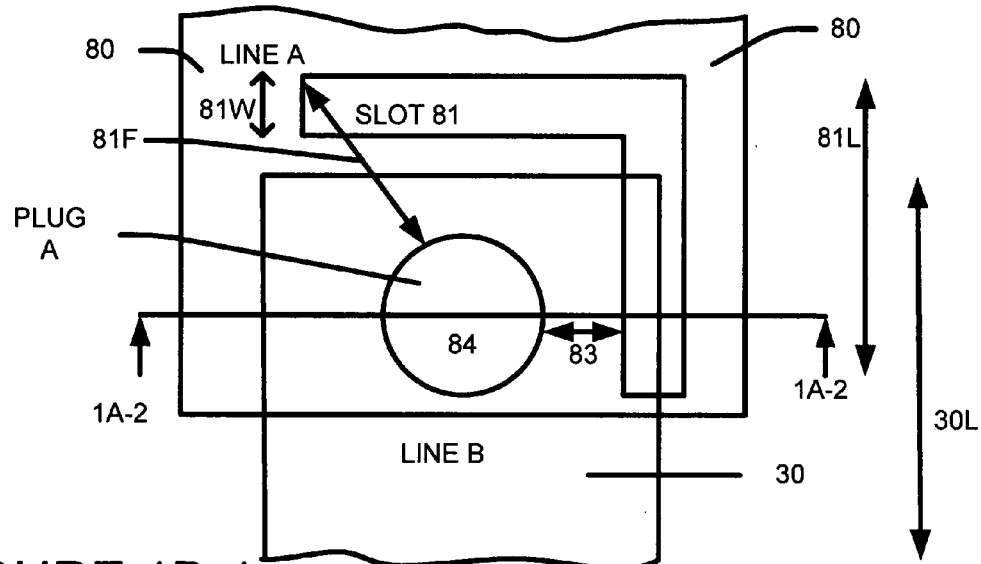
FIGURE 1B-1
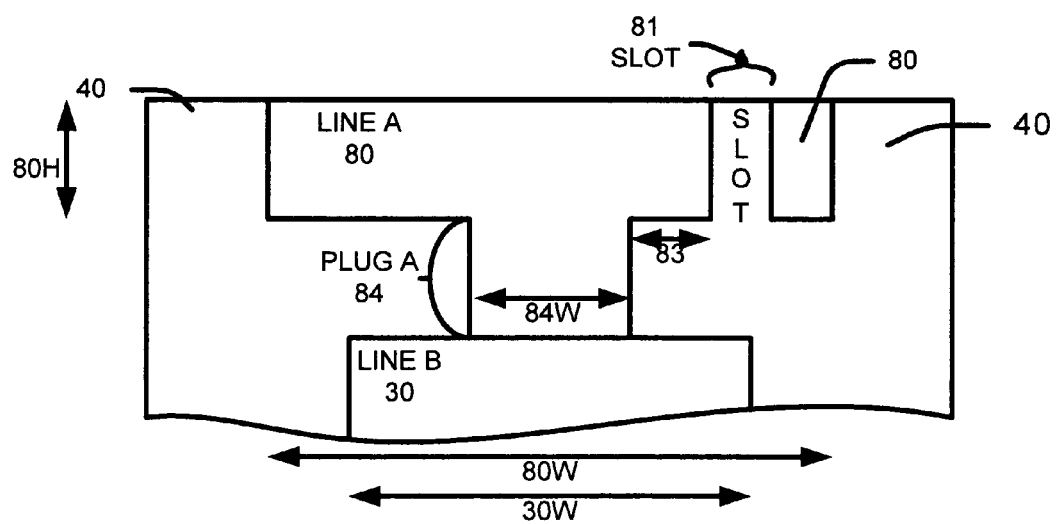
FIGURE 1B-2     TYPE 1 STRUCTURE

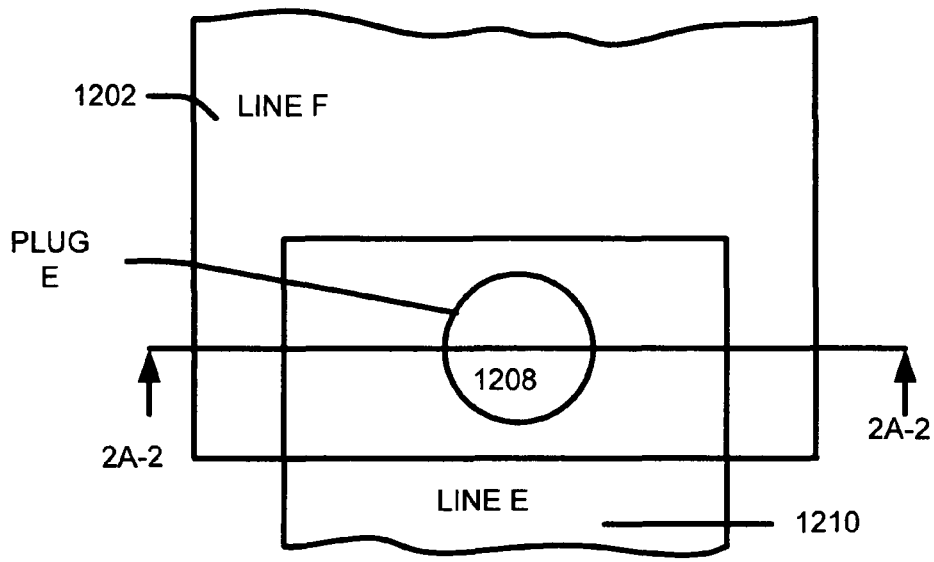
FIGURE 2A-1
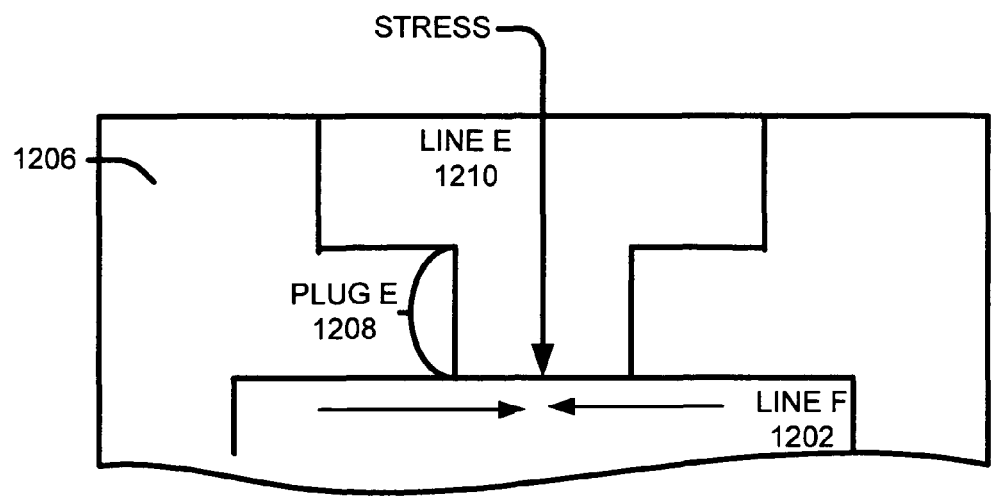
FIGURE 2A-2        TYPE 2 STRUCTURE

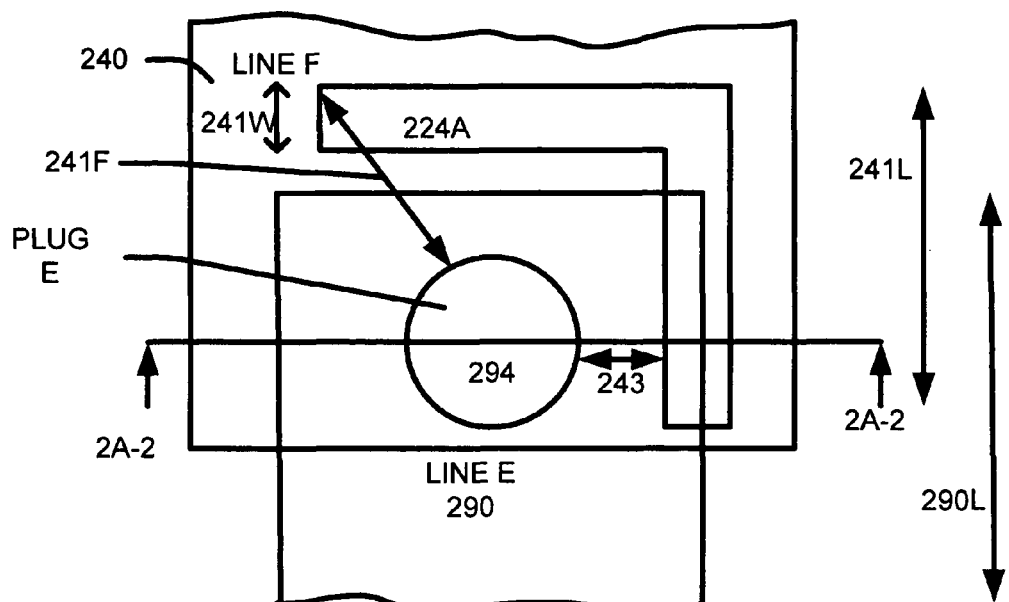
FIGURE 2B-1
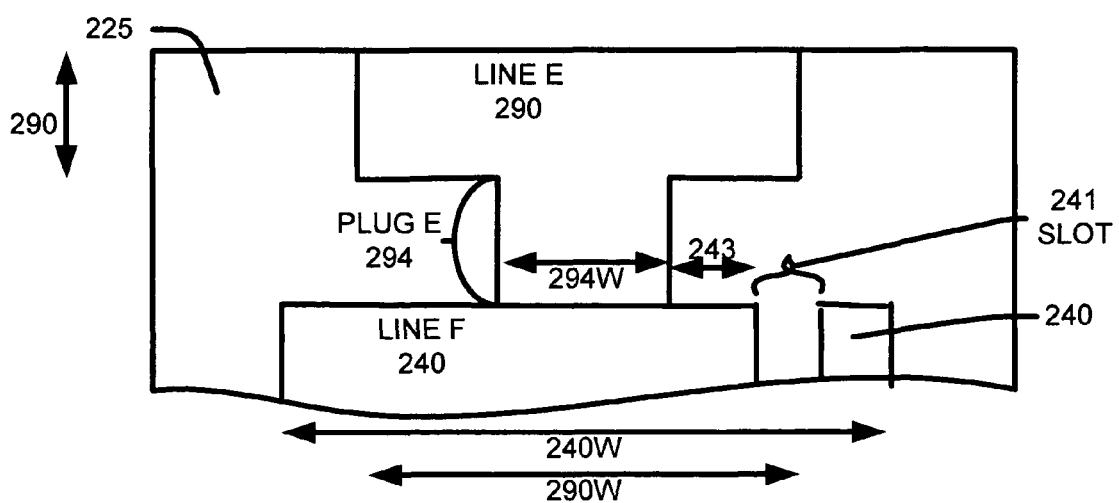
FIGURE 2B-2  TYPE 2 STRUCTURE

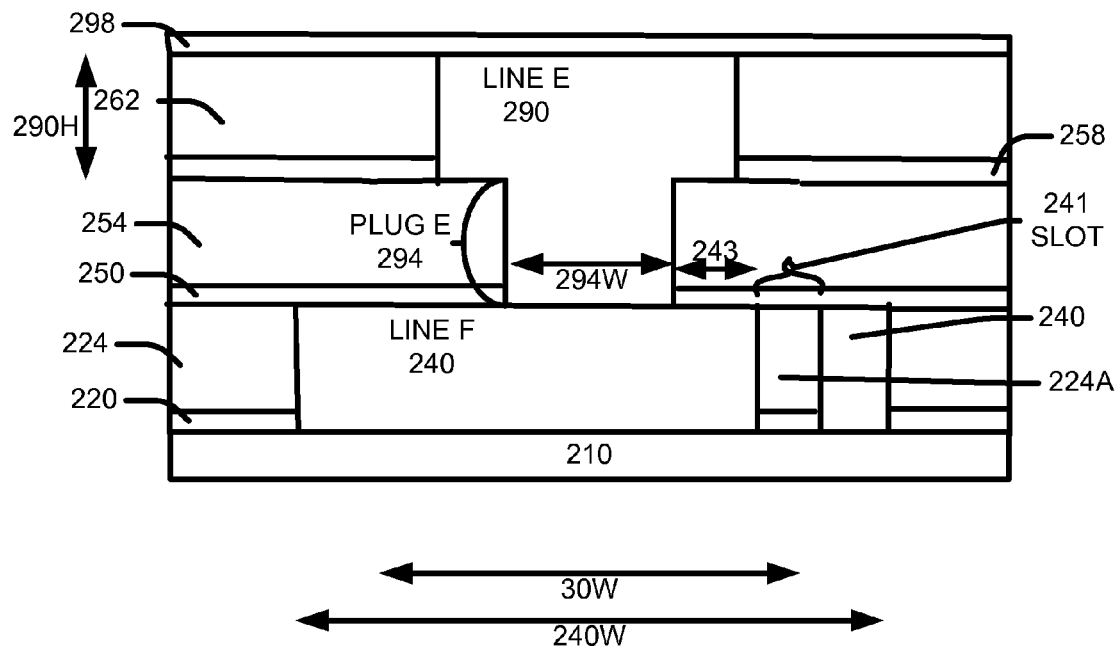
FIGURE 2C-9
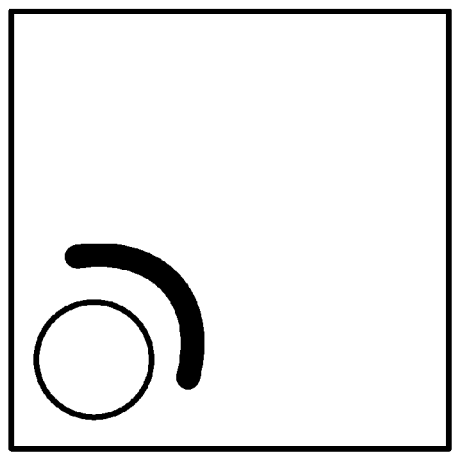
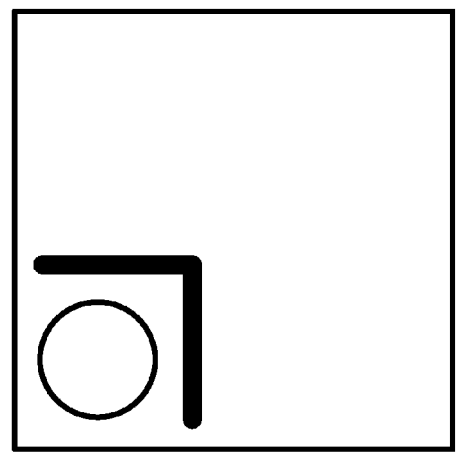
FIGURE 3A          FIGURE 3B

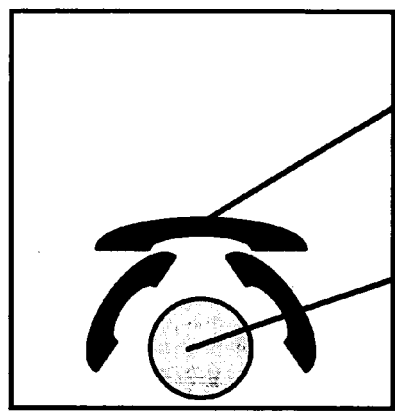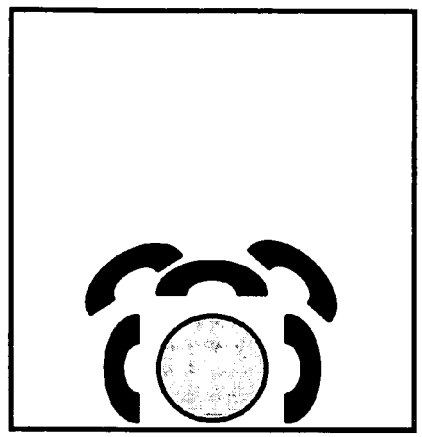
FIGURE 4E  FIGURE 4F
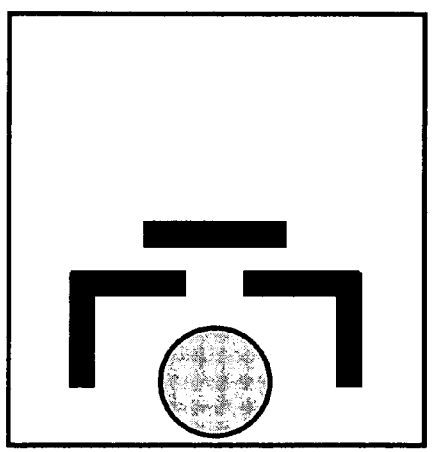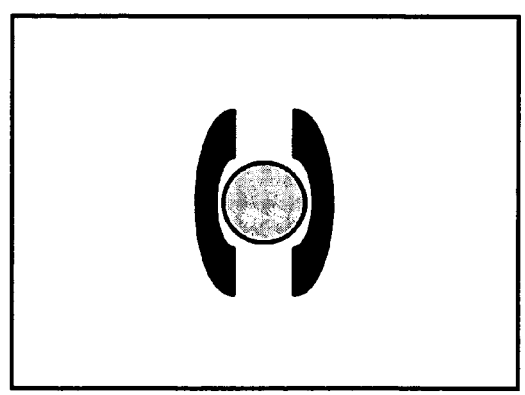
FIGURE 4G  FIGURE 4H

SLOT DESIGNS IN WIDE METAL LINES

BACKGROUND OF INVENTION

1) Field of the Invention

This invention relates generally to design and fabrication of metal lines and more particularly to fabrication of slots in metal lines for semiconductor devices.

2) Description of the Prior Art

The downward scaling of feature sizes in very large scale integration (VLSI) fabrication has resulted in the transition of the interconnect technology from Aluminum (Al) to Copper (Cu) for faster device performance. Owing to the differences between Al and Cu process, studies on the reliability performance such as electromigration (EM) between Al and Cu interconnects had since rose in importance. Less attention has been focused on the study of stress-induced voiding in Cu interconnects because of its favorable properties such as lower mobility and similar intrinsic stress level as compared to Al interconnects. However, this assumption has been illustrated to be opportunistic because of copper's strong dependency on process and structure.

Relevant patent and technical literature are shown below.

U.S. Pat. No. 6,528,883—Dunham, et al.—shows Shapes-based migration of aluminum designs to copper damascene. An interconnect structure for use in semiconductor devices which interconnects a plurality of dissimilar metal wiring layers, which are connected vias, by incorporating shaped voids in the metal layers.

U.S. Pat. No. 5,959,360 Fu—shows an interconnect structure employing equivalent resistance paths to improve electromigration resistance.

US 20030228714 A1—Smith et al. Dummy fill for integrated circuits—The described methods use process variation and electrical impact to direct the insertion of dummy fill into an integrated circuit.

U.S. Pat. No. 6,391,766—Wang, et al. shows a method of making a slot via filled dual damascene structure with middle stop layer.

U.S. Pat. No. 6,489,684 Chen, et al. shows a reduction of electromigration in dual damascene connector. Local back-diffusion sources serve to increase back pressure on the metallic ions that makes up the wire, thereby reversing the trend towards electromigration. These sources are located close to the vias in question and may take the form of discrete local areas where the wiring is wider or they may be introduced in the form of dummy vias.

U.S. Pat. No. 5,696,030—Cronin Integrated circuit contacts having improved electromigration characteristics and fabrication methods therefor. Increased cross-sectional contact sections are employed, with conducting studs in contact therewith.

SUMMARY OF THE INVENTION

Embodiments of the present invention provides a structure and method of forming an interconnect structure comprising a wide line having a slot. The slot relieves stress induced voids and vacancies in the interconnect.

An embodiment is an interconnect structure with slot(s) in wide lines to reduce stress. The interconnect structure preferably comprises: an interconnect comprising a wide line; the wide line has a first slot; a via plug in contact with the wide line from above or below; the first slot is spaced a first distance from a via plug so that the first slot relieves stress and/or induced voiding on the wide line and the via plug.

Another embodiment is a dual damascene interconnect Structure comprising: an dual damascene shaped interconnect comprising a via plug, a first slot and a wide line; said wide line having said first slot; said first slot is spaced a first distance from said via plug so that said first slot relieves stress on the wide line and the via plug.

Another embodiment is an interconnect structure comprising: a lower interconnect comprised of a wide line; said wide line having a first slot; an upper interconnect comprised of a via plug; said via plug contacting the top surface of said wide line; said first slot is spaced a first distance from said via plug so that said first slot relieves stress on the wide line and the via plug.

The embodiments of the invention further comprise the method to make the slots are defined further in the specification and claims.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A-1 and FIG. 1A-2, show an example structure over which example embodiments of the present invention are an improvement. FIG. 1A-1 is a top down view of an interconnect structure. FIG. 1A-2 is a cross sectional view along axis 1A-2 in FIG. 1A-1.

FIGS. 1B-1 and 1B-2 show an example embodiment of an interconnect having a slot according to an example embodiment of the invention. FIG. 1B-2 is a cross sectional view taken along axis 1B-2 in top down view FIG. 1B-1.

FIGS. 1C-1 to 1C-6 show a non-limiting example method for forming interconnect with slots in wide lines to relieve type 1 stress according to an example embodiment.

FIG. 2A-1 shows a top down view of the upper dual damascene interconnect and an underlying wide line over which example embodiments of the present invention are an improvement.

FIG. 2A-2 is a cross sectional view of the upper dual damascene interconnect and an underlying wide line over which example embodiments of the present invention are an improvement.

FIG. 2B-1 and 2B-2 show an example embodiment of an interconnect having a slot that reduces stress such as type 2 stress. FIG. 2B-2 is a cross sectional view taken along axis 2B-2 in top down view FIG. 2B-1.

FIGS. 2C-1 thru 2C-9 show a non-limiting example method of forming an interconnect structure having a first slot to relieve type 2 stress according to an example embodiment.

FIGS. 3A thru 3J shows top down example embodiments of the shapes and positions of the wide line, slot(s) and via plug according to an example embodiments of the invention.

FIGS. 4A thru 4K shows top down example embodiments of the shapes and positions of the wide line, slot(s) and via plug according to an example embodiments of the invention.

DETAILED DESCRIPTION OF THE PREFERRED EMBODIMENTS

Figures 1, 1C:
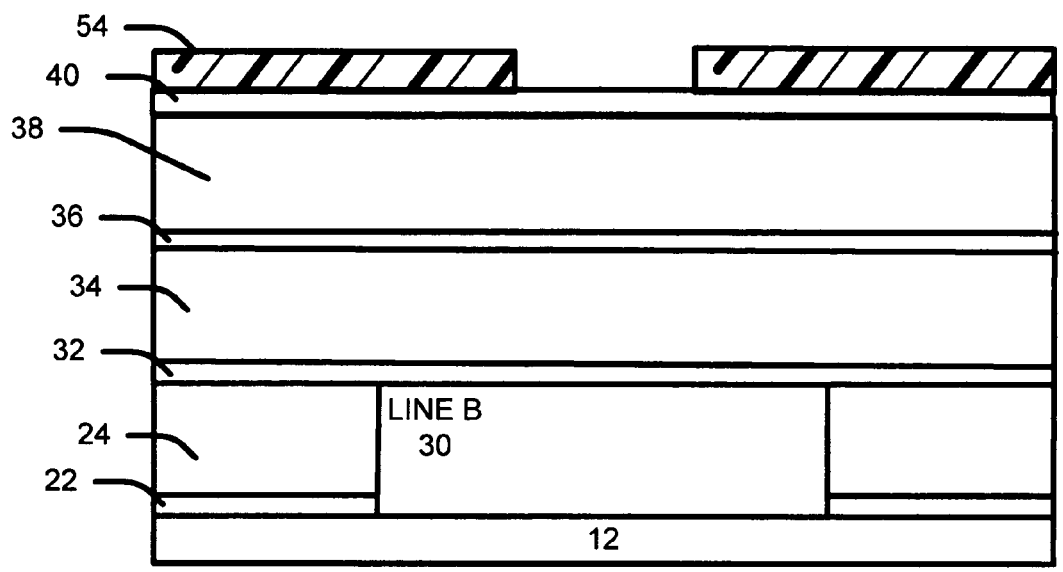
Figures 1, 1C, 2:
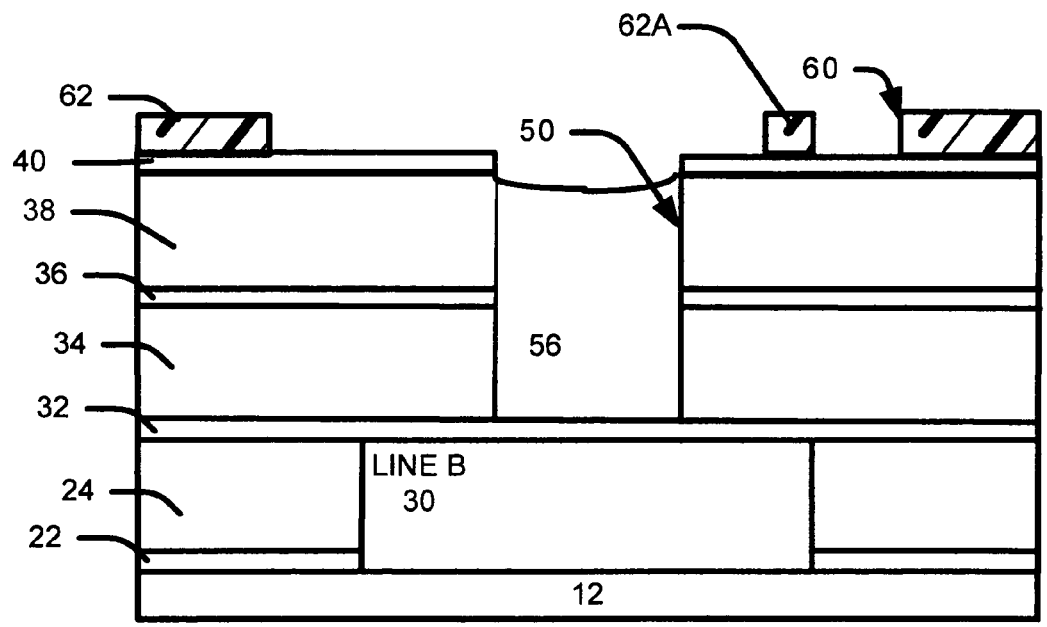

Referring now to the drawings and more particularly to FIG. 1A-1 and FIG. 1A-2, there is shown an example structure over which example embodiments of the present invention are an improvement. It is to be understood in this regard that no portion of FIG. 1A-1 or FIG. 1A-2 are admitted to be prior art. Rather, this highly simplified diagram is an effort to provide an improved understanding of some problems.

Type 1 Stress—Wide Line 1010 Over the Via Plug 1008 that Contacts the Lower Line 1004

FIG. 1A-1 shows a top down view of the upper dual damascene interconnect 1008 1010, an underlying line 1004 and a dielectric 1006. FIG. 1A-2 shows a cross sectional view. The upper dual damascene interconnect is comprised of a via plug 1008 and a wide line 1010. Type 1 stress 1014 is created by the wide line 1010 over the via plug 1008 that contacts the lower line (interconnect) 1004.

Type 1 Stress induced voiding mechanisms can include: 1) vacancies/void migration to via bottom and 2) Cu contraction during cooling and high tensile stress up the via.

Type 2 Stress—the Via Plug that Contacts the Wide Lower Line

FIG. 2A-1 shows a top down view of the upper dual damascene interconnect 1210 1208, an underlying wide line 1202, and dielectric 1206. FIG. 2A-2 shows a cross sectional view. The upper dual damascene interconnect is comprised of a via plug 1208 and a line 1210. Type 2 stress is created by an overlying via plug 1208 that contacts the lower wide line 1202. Type 2 stress mechanism can be similar to type 1.

I. Example Embodiments

Example embodiments of the present invention will be described in detail with reference to the accompanying drawings. Example embodiments of the present invention provide structures and methods of forming slots (e.g., openings) in wide metal lines near via plugs where the slots relieve stress caused by the wide lines and via plugs. In example embodiments, the only slots in the wide lines are slots position near the via plug that reduce stress.

II. Structure for Type 1

FIGS. 1B-1 and 1B-2 show an example embodiment of an interconnect having a slot that reduces type 1 stress. FIGS. 3A thru 3J shows top down example embodiments of the shapes and positions of the wide line, slot(s) and via plug.

FIG. 1B-2 is a cross sectional view taken along axis 1B-2 in top down view FIG. 1B-1.

FIGS. 1B-1 and 1B-2 show a dual damascene interconnect Structure 80 84 having a slot 81. The figures show a so called type 1 structure where a line 80, wide enough to cause stresses, is over a via plug 84. A stress created is type 1 stress. Wide line 80 has a width 80W and lower line 30 has a width 30W with 80W being greater than 30W as shown in FIG. 1B-2.

A dual damascene shaped interconnect can comprise a via plug 84, a first slot 81 and a wide line 80. The wide line has at least a first slot 81. The slot is a hole or space in the line. The slot can be filled with dielectric material or another metal. The dielectric material can include various CVD/Spin on low-K dielectric materials.

Description of the Location and Size of the Slot to Relieve Stress

The slot 81 in the wide line 80 is spaced 83 from the via plug 84 to relieve stress caused by the wide line 80 over a via plug 84. The wide line preferably has a width 80W large enough to cause the (type 1) stress.

Wide Line

The wide line 80 has a width 80W wide enough to cause the (type 1) stress. For example wide line that causes stress can have a width between 1.0 and 20 µm. The wide line can have height 80H between 2000 and 6000 Å. The wide line can have width 80W greater than 1.4 µm and a height greater than 3000 Å. More preferably the wide line has a width between 1 and 10 µm and preferably greater than 1.4 µm.

In another example, a wide line that causes stress can have a width 80W between 2.6 and 105 times the width/diameter of the via plug, (e.g., 0.19 µm).

In another example, a wide line that causes stress can have a height (wide line) to Width (wide line) ratio between 1:2.5 and 1:33.3.

The stresses will increase as the height to width of the wide line increases.

Via Plug

The via plug can preferably have a diameter or width between 0.15 and 0.5 µm.

The via plug can have shapes such as a cylindrical shape, or rectangular box shape. Preferably the via plug has a cylindrical shape.

Other Factors for Stress Induced Voiding

Stress-induced voiding can have other structural and process dependencies. For example, weak point in the dual damascene interconnect can be caused by poor diffusion barrier coverage. Also, the number of vacancies present in Cu can influence the Stress. A non-optimized anneal can lead to more vacancies and increase in Cu volume can increase vacancies present. The embodiment's slot may be incorporated into lines that are normally not thought to be at risk for stress for their wide widths.

Slot & Spacing from PLUG

To relieve stress, such as type 1 and 2 stress, the width 81W of the first slot 81 is between about 135 and 315% of the effective diameter 84W, (e.g., 0.19µm) of the via plug 84 and is more preferably between 185 and 265% of the effective diameter 84W of the via plug.

Also the slot 81 is spaced a first distance 83 from the via plug 84 so that the slot relieves stress on the wide line 80 and the via plug 84.

The first slot 81 is preferably positioned a minimum first distance away from the via plug.

The minimum first distance (83) is between the closest point of the slot to the via plug is between 0.05 μm and 0.25 μm. The minimum first distance 83 can be between about 26% and 132% of the effective diameter 84W, (e.g., 0.19 μm) and more preferably is between about 26 and 53%.

For example, for a wide line 80 with a width 80W of 1.4 μm or greater, the via plug 84 has a diameter 84W of 0.19 μm, and the minimum first distance (83) is preferably 0.05 μm.

Preferably, the most distant point of a slot from the via plug is preferably a distance 81F between 0.855 and 1.205 μm and more preferably between 0.955 and 1.105 μm. Preferably, the most distant point of a slot from the via plug is preferably a distance 81F between 447 and 632% of the via plug diameter and more preferably between 500 and 579%. Beyond this distance, the relives stress appears to decrease.

Figure 3C:
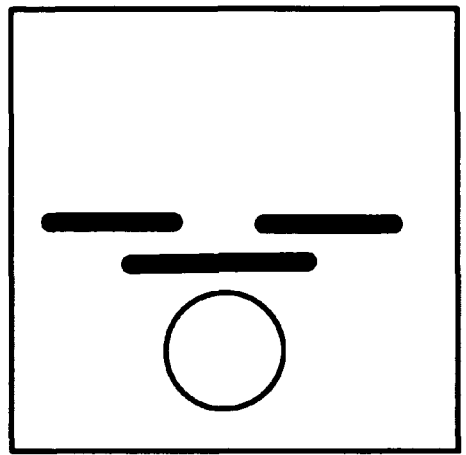
Figure 3D:
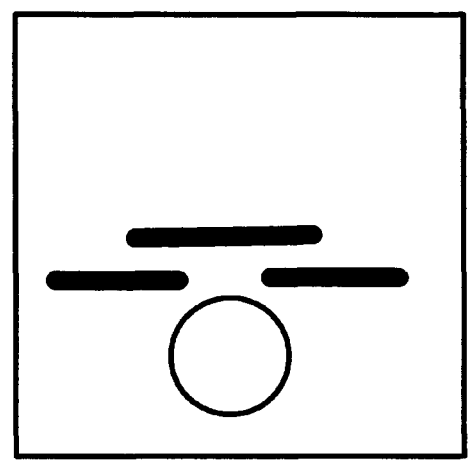
Figure 3E:
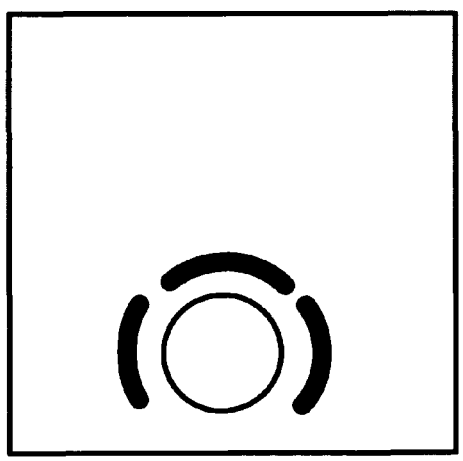
Figure 3F:
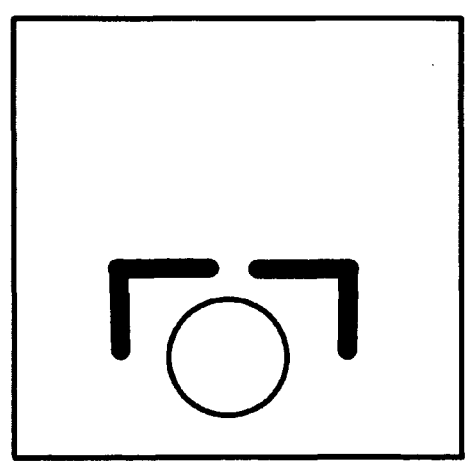
Figure 3G:
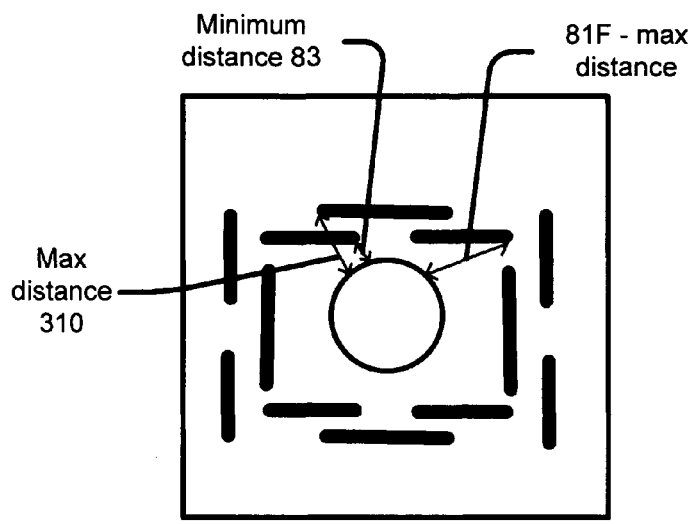

In a preferred embodiment, referring for example to FIG. 3G, in an embodiment that has 2 or more rows or radius's (or acrs's) of slots, the maximum distance 310 between farthest slot (e.g. 2$^{nd}$ row) and plug is a distance 310 about between 1.355 μm and 2.055 μm and more preferably between 1.555 μm and 1.855 μm.

The total length of the first slot 81 is preferably between about 265 and 1380% of the effective diameter 84W of the via plug and is more preferably between about 530 and 1380% of the effective diameter 84W of the via plug. The length 81L of one leg of a L-shaped structure (e.g., 2 legs) of the first slot is preferably between about 265 and 655% of the effective diameter of the via plug and more preferably between 350 and 525%. For example, for a L shaped slot, the total length is the total of the length of the 1$^{st}$ leg and 2$^{nd}$ leg.

The slot 81 can have a width or diameter 81W between 135 and 315% of the width/diameter 84W of the via plug 84 and more preferably between 185 and 265%.

Shapes of Slot

The first slot can have shape such as a rectangular shape (top view), a L-shaped bar structure (top view), a curve shape bar shape (top view). For example see FIGS. 3A to 3J and 4A to 4K. The parameters discussed above can apply to the various shapes and combination of shapes shown in the figs.

A most preferred slot shape that relieves stress is curved shaped slot. A curved shaped slot can effectively block the vacancies diffusing and reduce the effective volume of Cu without significantly increasing the metal line resistance.

Summary of Configuration of Slots, Lines, Via Plugs for Type 1 and 2

Below is a table summarizing some dimensions for type 1 and type 2 interconnect structure.

TABLE A

Some type 1 and 2 dimensions

| element | dimension | preferred low | preferred high | more preferred low | more preferred high | other |
|---|---|---|---|---|---|---|
| wide line (80 or 240) | Width (80 W or 240 W) | 1.0 μm | 20 μm | 1.0 μm | 10 μm | =or >1.4 μm |
| wide line | Height (angstroms) | 2000 Å | 6000 Å | 3000 Å | 5000 Å | |
| via plug | width | 0.15 μm | 0.5 μm | | | e.g., 0.19 micron |
| slot (81 or 241) | width | 135% | 315% width of via plug | 185% | 265% width of via plug | |
| slot (81 or 241) | Length of a leg of an L-shaped slot | 265% | 655% width of via plug | 350% | 525% width of via plug | |
| Min distance (83, 243) between slot and plug | | 0.05 μm | 0.25 μm | 0.05 μm | 0.1 μm | |
| Max distance 81 F between slot and plug | distance 81 F | 0.855 μm | 1.205 μm | 0.955 μm | 1.105 μm | |
| Max distance 310 between farthest slot (e.g., 2nd row) and plug | distance 310 (see FIG. 3G) | 1.355 μm | 2.055 μm | 1.555 μm | 1.855 μm | |

III. Type 2 Structure

FIGS. 2B-1 and 2B-2 show an example embodiment of an interconnect having a slot that reduces stress such as type 2 stress. A so called "type 2" structure comprises a wide line (with slot) under a via plug. FIGS. 3A thru 3J shows top down example embodiments (for type 1 and type 2 structures) of the shapes and positions of the wide line, slot(s) and via plug.

FIG. 2B-2 is a cross sectional view taken along axis 2B-2 in top down view FIG. 2B-1.

FIGS. 2B-1 and 2B-2 show an interconnect structure comprising a lower level interconnect comprised of a wide line 240. The lower level interconnect can be a dual damascene interconnect with a via plug (not shown) under the wide line 240. The interconnect can be formed in a dielectric layer 245. The dielectric layer 245 can be comprised of one or more dielectric layers and/or capping layers. The wide line 240 has a first slot 241. The slot can be filled with dielectric or conductive material and is most preferably filled with dielectric material. Wide line 240 has a width 240W and upper line 290 has a width 290W with 240W being greater than 290W as shown in FIG. 2B-2.

The upper interconnect is comprised of a via plug 294. In this example the via plug 294 is part of a dual damascene interconnect having a upper line 290. The via plug can be also be a stand alone via plug without an overlying line.

The via plug 294 contacts the top surface of the wide line 240.

The first slot 241 is spaced a minimum first distance 243 from the via plug 294 so that the first slot relieves stress on the wide line 240 and the via plug 294. Preferably the first slot 241 is placed a maximum distance 241F from the via plug 294.

The placement and sizes of the lines, via plugs and slots are the similar as described above and below for the type 1 structure example embodiments.

IV. 2 or More Slots—for Type 1 and 2 Structures

Referring to FIGS. 3A thru 3J and 4A thru 4K, are top down views example embodiments of interconnects with slots. The via plug can be below (see e.g. FIG. 1B-2 "type one structure") or above (see e.g., FIG. 2B-2, "type 2 structure") the wide lines with slots. Theses arrangements can be applied to type 1 or type 2 structures or stresses. The examples include slots formed in one row or radius's from the plug. Preferably the slots are formed in only one or two rows/radius's from the plug. Other examples show slots formed in two rows or radius's (distances) from the plug. The size and placement of slot with respect to via plugs and lines is preferably the same as described above.

FIGS. 3A and 3B show examples of designs with the via plug located near a corner or side of the wide line.

FIG. 3A shows an example where the slot has a top down view curved shape. Also preferably the slot and the via plug are about concentric.

FIG. 3B shows an example where the slot has a top down view L shape.

FIGS. 3C thru 3J show examples of a dual damascene interconnect structure where the wide line has more than one slot. The slot are preferably symmetrical around the via plug.

FIG. 3C and 3D shows examples of embodiments with 3 slots arranged in 2 space rows about parallel with a side of the wide line closest to the via plug. The slot is preferably about centered in the wide line. FIGS. 3C and 3D, show an examples where the slot the dual damascene interconnect further includes a second slot in the wide line. Preferably the distance between the first slot and the second slot is between 110% and 150% of the effective diameter/width of the via plug.

FIG. 3E shows a view of curved slots around 3 sides of a via plug.

FIG. 3F shows a view of 2 L shaped slots around 3 sides of a via plug.

FIG. 3G shows a via plug centered in a wide line. A first set of slots spaced outwardly from the via plug. A second set of slots is spaced from the first set of slots. The slot are symmetric along an x and/or y axis thru the via plug.

In a preferred embodiment, referring for example to FIG. 3G, the maximum distance 310 between farthest slot (e.g. $2^{nd}$ row) and plug is a distance 310 about between 1.355 μm and 2.055 μm and more preferably between 1.555 μm and 1.855 μm.

Figure 3H:
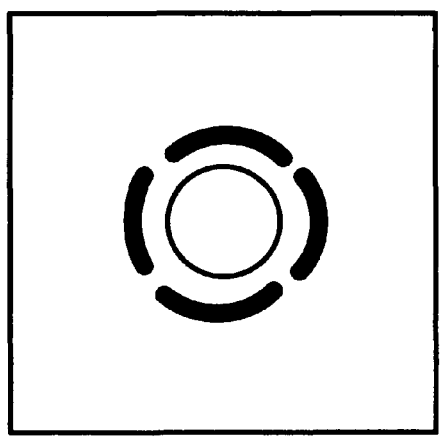

FIG. 3H shows a 4 radically spaced curved slots arranged about concentric around the via plug.

Figure 3I:
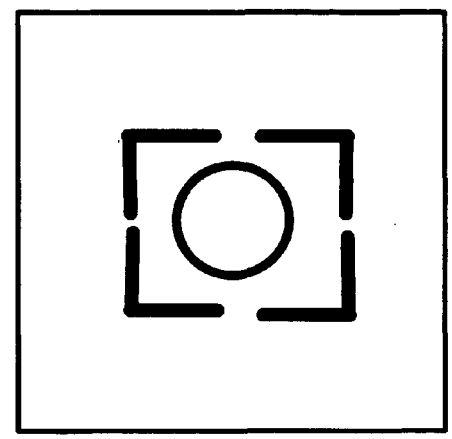

FIG. 3I shows 4 L-shaped slots arrange symmetrically around the via plug.

Figure 3J:
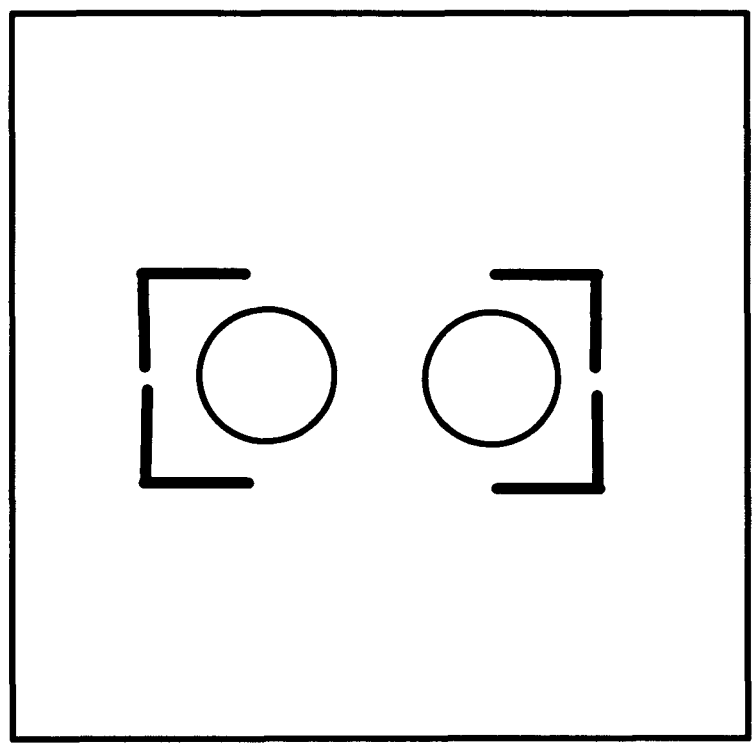

FIG. 3J shows an embodiment where two adjacent via plugs are positioned contacting the wide line. Four L-shaped slot are positioned symmetrically around the 2 via plugs.

In general, if the via plug is placed at a corner of a wide line, less slots are needed. If the via plug is placed at the center of a wide metal line, more slots are needed to reduce problems.

FIGS. 4A thru 4K shows top down example embodiments of the shapes and positions of the wide line, slot(s) and via plug according to an example embodiments of the invention.

Figure 4A:
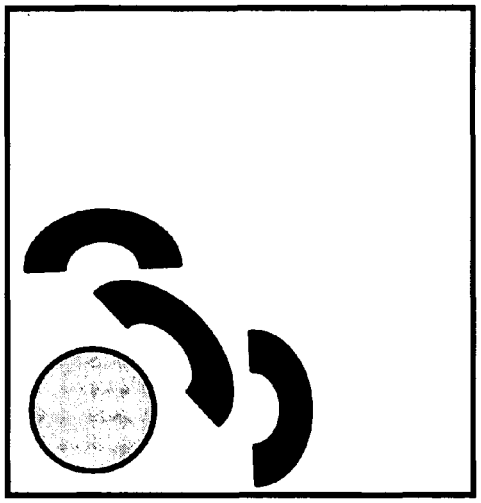

FIG. 4A shows an example where the slots have a top down view curved shape. There are 3 slots. Two slots arranged about an about 90 orientation and one a about a 45 degree orientation to the plug.

Figure 4B:
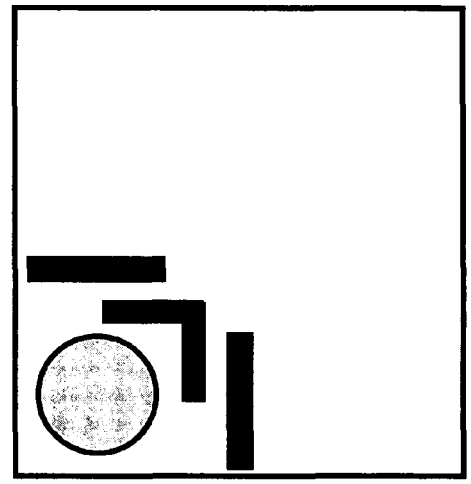

FIG. 4B show a L shaped slot and two line slots arranged at about 90 degree angles.

Figure 4C:
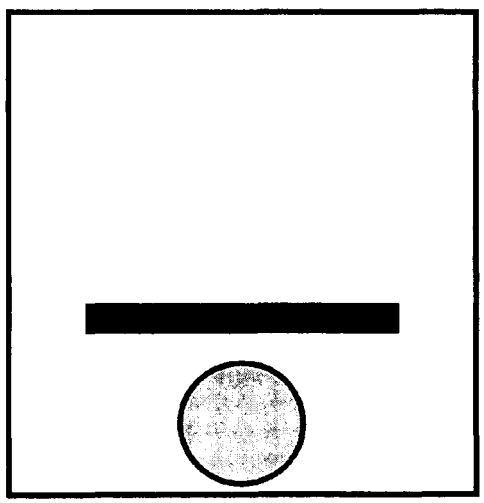

FIG. 4C shows a straight slot with the plug located in the middle and near one end of the line.

Figure 4D:
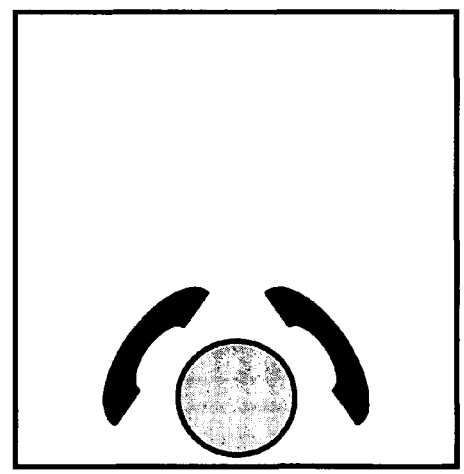

FIG. 4D, shows two curved slots around a plug located in the middle and near one end of the line.

FIG. 4E shows three curved slots positioned at 2 (distances) radiuses or rows around the plug.

FIG. 4F shows five slots positioned in 2 rows or radius's around the plug.

FIG. 4G shows two L-shaped slots and a straight slot around a plug.

FIG. 4H shows two curved slots around a plug.

Figure 4I:
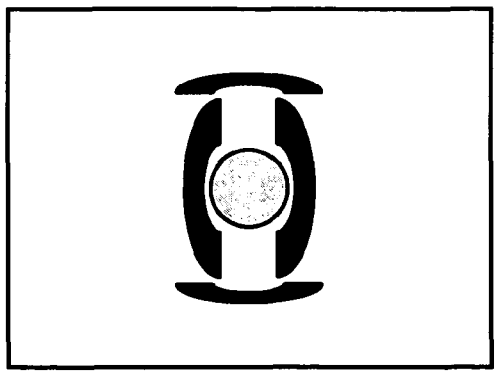

FIG. 4I shows two sets of two curved slots around a plug.

Figure 4J:
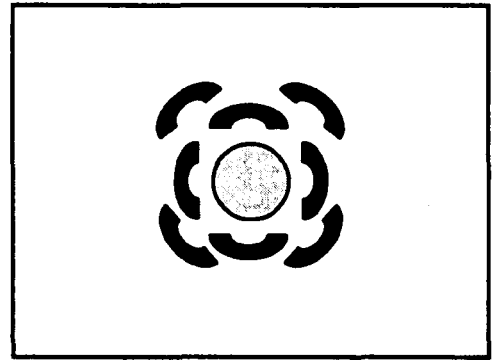

FIG. 4J shows two sets of four curved slots (in 2 radius's) around a plug.

Figure 4K:
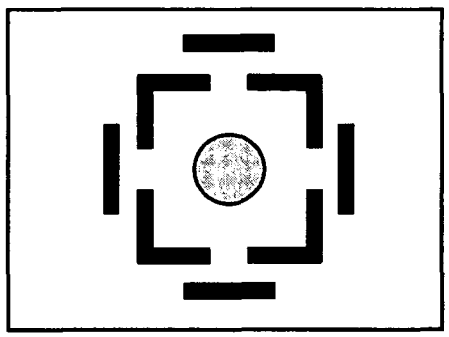

FIG. 4k shows two L-shaped slots and four straight slot around plug.

In the embodiments shown in FIG. 3A to 33J and 4A to 4K, the example parameter (e.g., dimensions) described above can be used. For example, total length of a slot is preferably between about 265 and 1380% of the effective diameter of the via plug (e.g., 0.19 microns) and more preferably between 530 and 1380%. For example, the length single line slot or curved slot can be between about 265 and 655% of the effective diameter (e.g., 0.19 microns) of the via plug and more preferably between 350 and 525%.

V. Example Method Embodiment for Slots in Lines

A. Type 1

FIG. 1C-1 to 1C-6 show a non-limiting example method for forming an embodiment with slots in wide lines to relieve type 1 stress. There are many methods and variations for forming the embodiments.

Below, the terms "first, second, etc.." levels are relative terms and do not refer to absolute positions.

Referring to FIG. 1C-1, we form a first barrier layer 22 over a semiconductor structure 12. The first barrier layer (an other barrier layers) can be comprised of silicon nitride.

Semiconductor structure 12 is understood to possibly include a semiconductor wafer, active and passive devices formed within the wafer; and insulating and conductive layers formed on the wafer surface. The term "structure surface" is meant to include the upper most exposed layers over a semiconductor wafer, such as a silicon surface, an insulating layer and/or conductive lines.

Preferably the top surface of the semiconductor structure 12 is comprised for the top surface of an dielectric layer, such as a interlevel dielectric or inter metal dielectric layer and further comprise exposed interconnects or contacts to underlying devices.

Next, we form a first ILD layer 24 over the first barrier layer 22.

Still referring to FIG. 1C-1, we form a lower line (interconnect) 30 over the semiconductor structure 12 in a lower line opening in the first barrier layer 22 and the first ILD layer 24.

We then form an upper first level barrier layer 32 over the lower line (interconnect) 30 and first ILD layer 24.

We form sequentially a lower (e.g., second level) dielectric layer 34, a middle (second level) barrier layer 36 and an upper (second level) dielectric layer 38 and an upper (second level) barrier layer 40 over the upper first level barrier layer 32. The middle barrier layer can be optional. The dielectric layers can be comprised of Low-K material.

We form a via plug mask layer 54 having a via plug mask opening over the upper (second level) dielectric layer 38.

Referring to figure IC-2, we form a via plug hole 50 in a lower (second level) dielectric layer 34, a middle (second level) barrier level 36 and an upper (second level) dielectric layer 38 and an upper (second level) barrier layer 40 to preferably expose the barrier layer 32.

We then remove the via plug mask layer 54.

We form an organic plug 56 at least partially filling the via plug hole 50. The organic plug is preferably comprised of a BARC.

Referring to FIG. 1C-2, we form a mask layer 62 having a slot mask pattern 62A that defines a first slot in a wide line. The mask layer 62 has openings 60 that defines the wide line.

Referring to FIG. 1C-3, we form a wide line opening 68 in the upper dielectric layer 38 and a first slot dielectric portion 38A by using the mask layer 62 as an etch mask.

As shown in FIG. 1C-4, we remove the mask layer 62 and the remaining organic plug (e.g., BARC) 56.

As shown in FIG. 1C-5, we remove the barrier layer 32 in the via opening 50 preferably using a breakthrough etch.

Referring to FIG. 1C-6, we form interconnects 80 and 84 in the via opening 50 and the wide line opening 68.

The interconnects 80 and 84 contact the lower line 30. 84 comprised of a via plug 84 and a wide line 80. The interconnect is preferably formed by a Cu plating process and CMP back to planarize.

The slot 81 and first slot dielectric portion 38A are positioned in the wide line 80 so that the first slot dielectric portion 38A relieves stress on the via plug 84 and the lower line 30. The slots are positioned and sized as described above to reduce stress induced voiding. The slots reduce the effective Cu volume to reduce the number of vacancies available for diffusing during stress and Cu volume contracting during cooling. The slots also block diffusion of vacancies during stress.

The first slot dielectric portion 38A defines a first slot 81 in the wide line 80.

B. Example Embodiment of a Type 2 Method

FIGS. 2C-1 thru 2C-6 show a non-limiting example method of forming an interconnect structure having a first slot to relieve type 2 stress.

The terms "first, second, etc.." levels are relative terms and do not refer to absolute positions.

Figures 1, 2C:
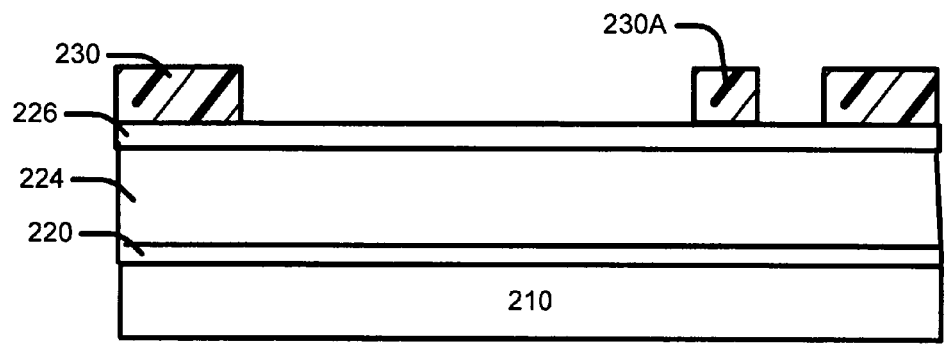
Figures 2, 2C:
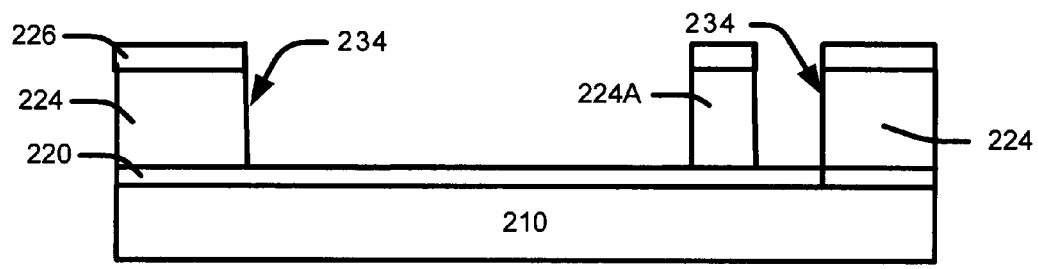
Figures 2, 2C, 3:
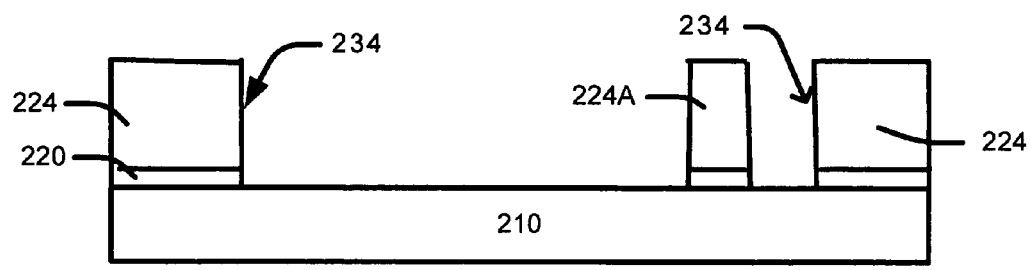
Figures 2, 2C, 3, 4:
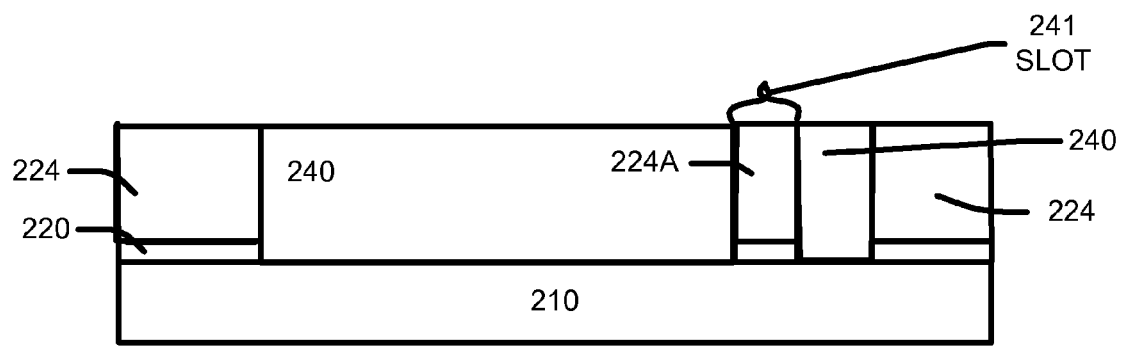
Figures 2, 2C, 3, 4, 5:
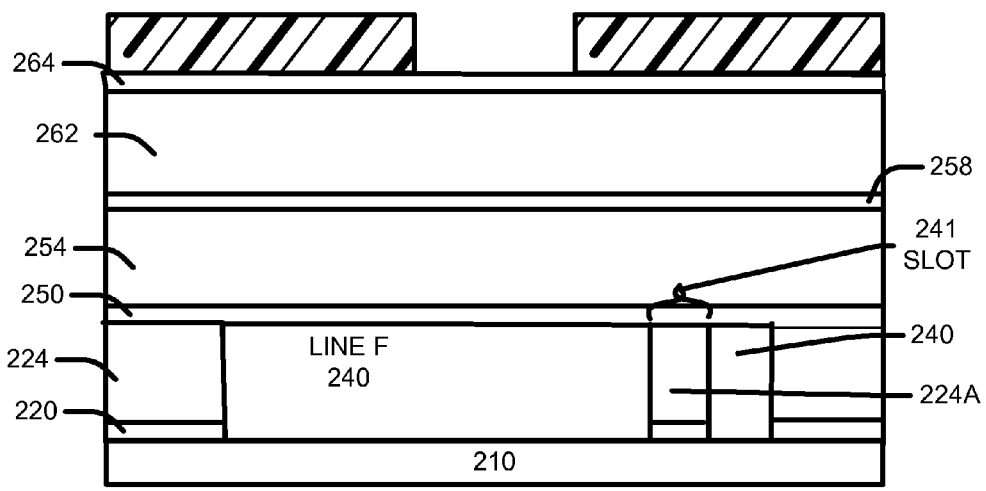
Figures 2, 2C, 3, 4, 5, 6:
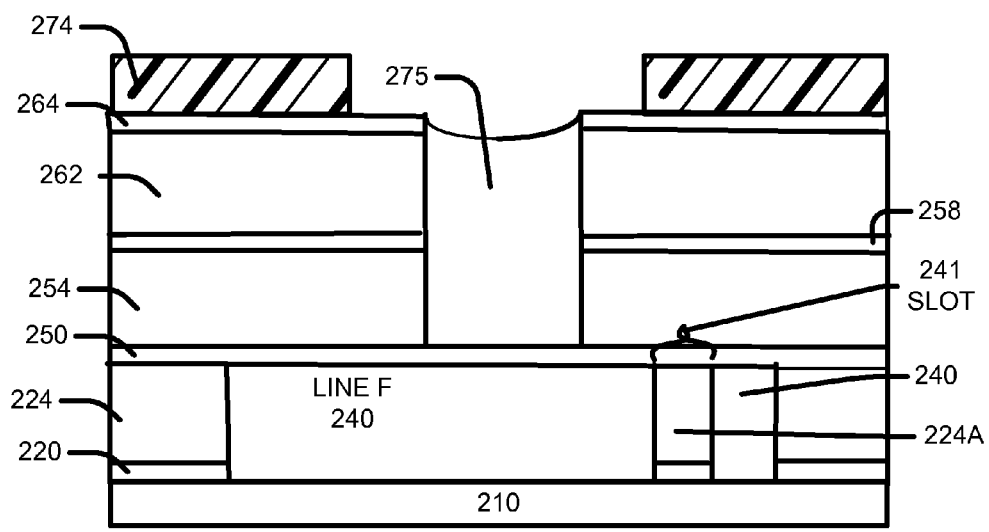
Figures 2, 2C, 3, 4, 5, 6, 7:
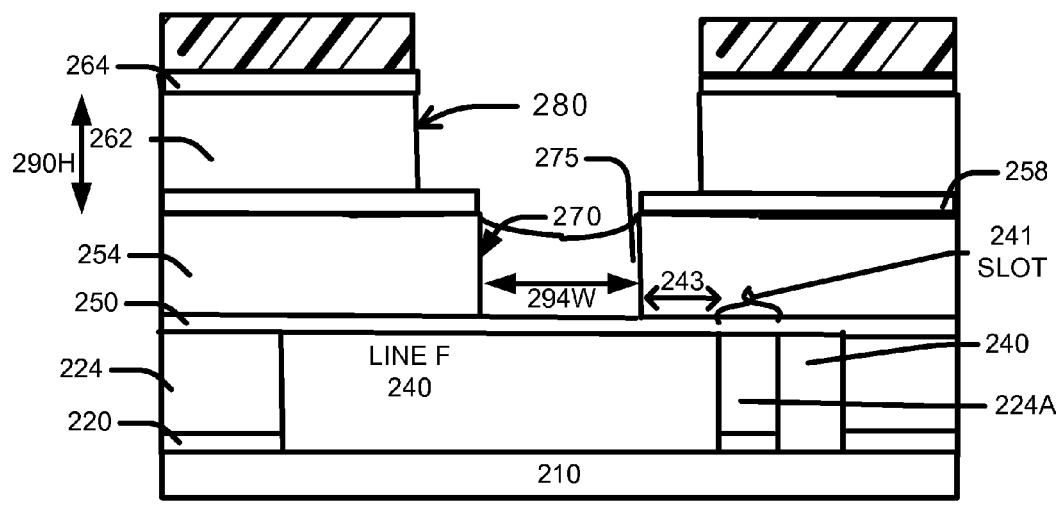
Figures 2, 2C, 3, 4, 5, 6, 7, 8:
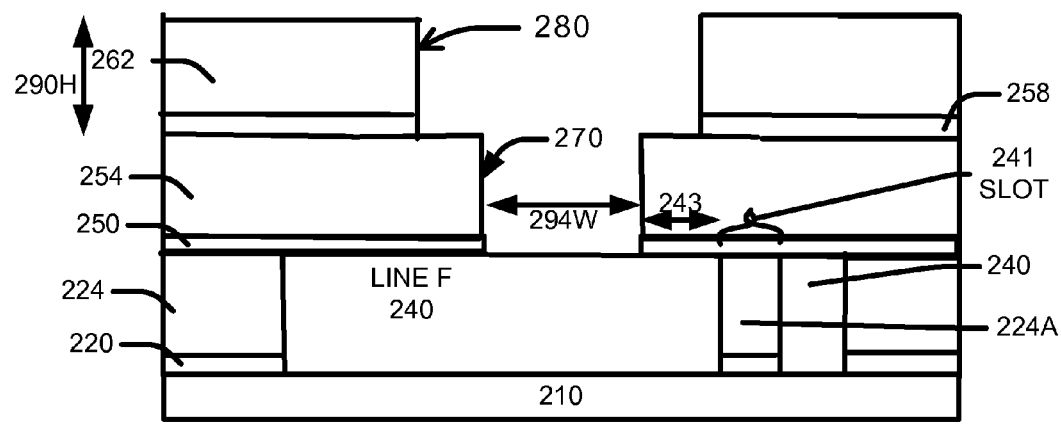

Referring to FIG. 2C-1, we form a lower (first level) barrier layer 220, a dielectric (e.g., inter metal dielectric ) layer 224 and a first level upper barrier layer 226 over a semiconductor structure 210.

A slotted wide line resist pattern 230 230A is formed over the first level upper barrier layer 226.

Referring to FIG. 2C-2, using the slotted wide line resist pattern 230 230A, we etch a slotted wide line opening 234 in the inter metal dielectric layer 224 and the upper barrier layer 226. The slotted wide line opening 234 defined at least by a dielectric first slot portion 224A.

Referring to FIG. 2C-2, the slotted wide line resist pattern 230 230A is then removed.

Figures 1, 1C, 2, 3:
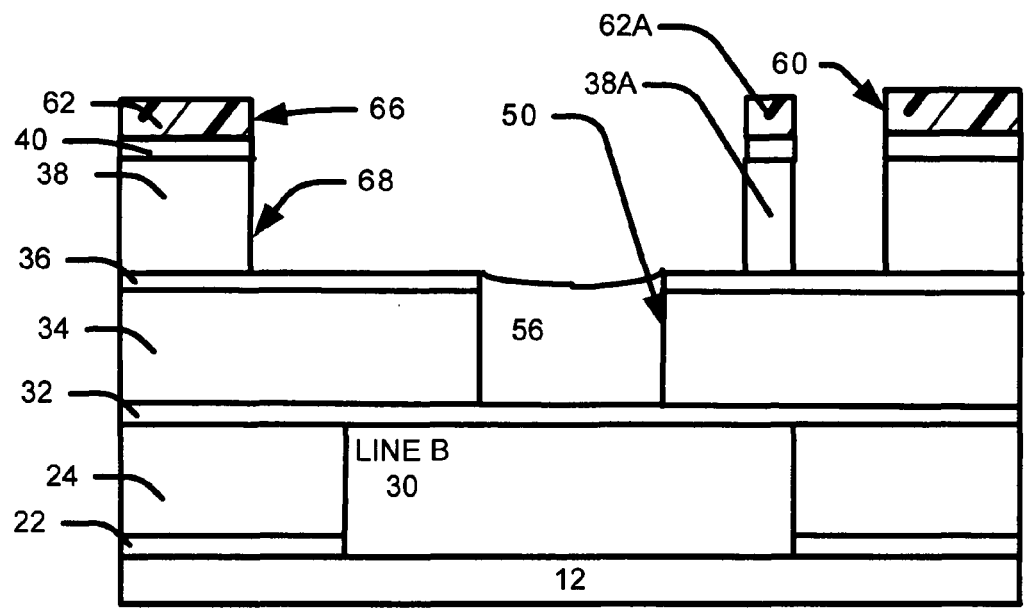
Figures 1, 1C, 2, 3, 4:
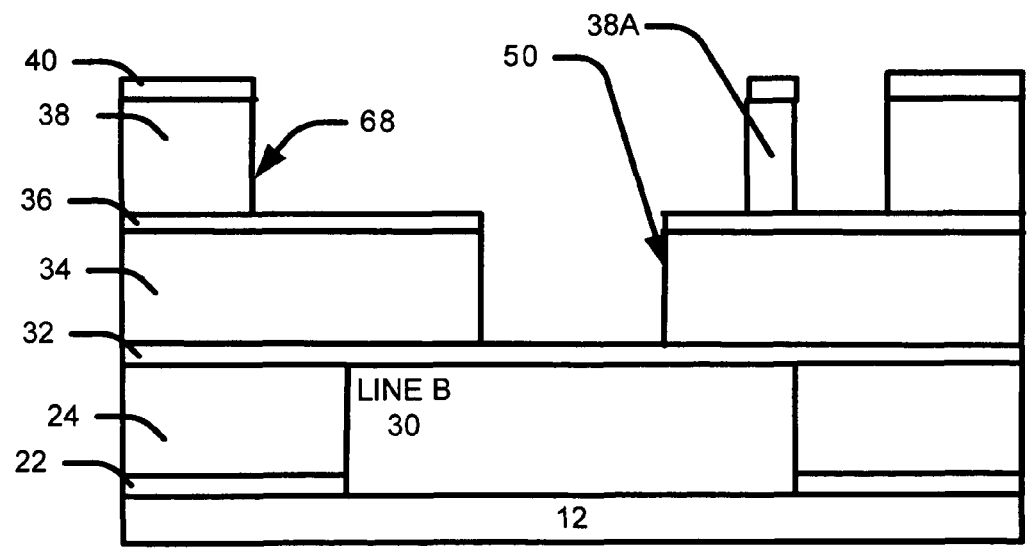
Figures 1, 1C, 2, 3, 4, 5:
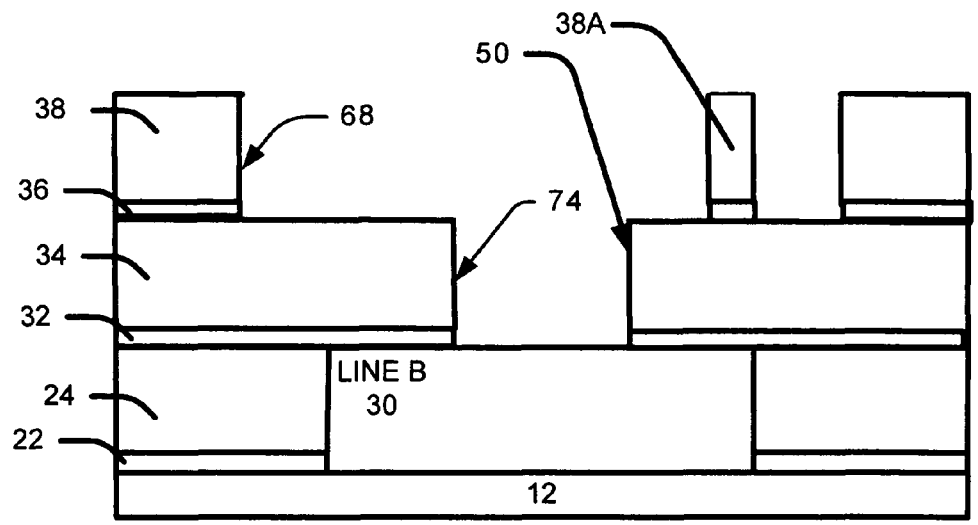
Figures 1, 1C, 2, 3, 4, 5, 6:
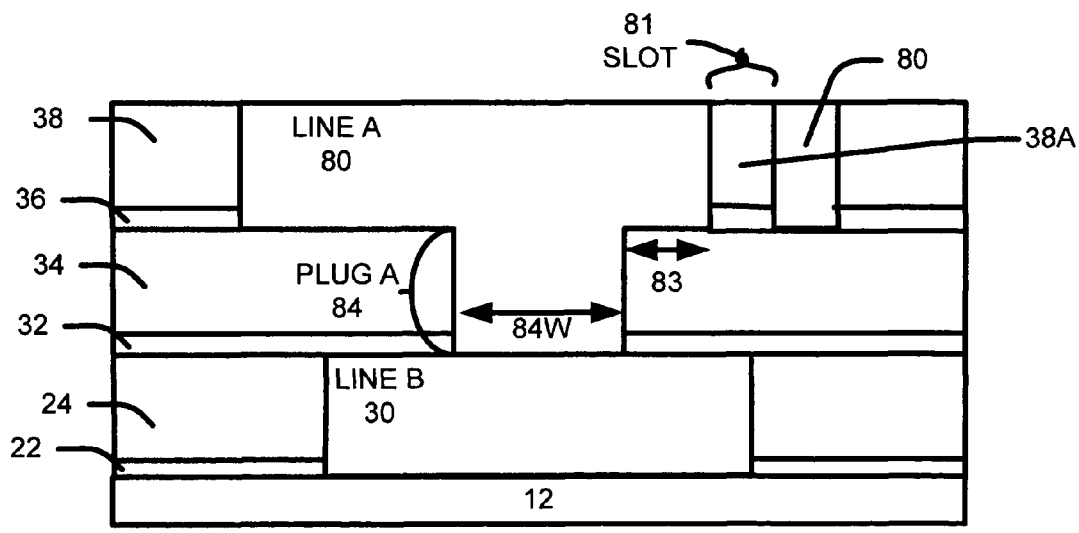

Referring to FIG. 2C-3, we then etch the lower (first level) barrier layer 220 in the wide line opening 234 to expose the semiconductor structure 210.

Referring to FIG. 2C-4, we form a wide line 240 filling the wide line opening 234. The dielectric first slot portion 224A forms a first slot 241 (opening) in the wide line 240.

Referring to FIG. 2C-5, we form a lower dielectric layer 254, a middle barrier layer 258 and an upper dielectric layer 262 and an upper barrier layer 264 over the wide line 240 and dielectric layer 224.

Referring to FIG. 2C-5, we form a via hole mask 266 having a via hole mask opening 268 over the upper dielectric layer 262 and the barrier layer 264.

Referring to FIG. 2C-6, then we form a via hole 270 in the lower dielectric layer 254, a middle barrier layer 258 and an upper dielectric layer 262 and an upper barrier layer 264.

We remove the via hole mask 266.

Referring to FIG. 2C-6, we form a line mask 274 having a line mask opening 278 over the upper barrier layer 264.

Referring to FIG. 2C-7, we form an organic plug 275 at least partially filling the via hole 270.

Referring to FIG. 2C-7, we form a line opening 280 in the a middle barrier layer 258, an upper dielectric layer 262 and an upper barrier layer 264.

Referring to FIG. 2C-8, we remove the line mask 274 and the BARC plug 276. The barrier layers are removed in the openings and over the dielectric 268.

Referring to FIG. 2C-9, we form an interconnect 290 294 in the line opening 280 and the via opening 270.

The interconnect 290 294 is preferably comprised of a via plug 294 and a line 290. The interconnect is preferably formed by a Cu plating and chemical-mechanical polish (CMP) planarization process.

A top cap layer 298 is formed.

The via plug contacts the wide line 240 and preferably does not contact the dielectric first slot portion 224A.

The dielectric first slot portion 224A is positioned with respect to the via plug so that the first slot dielectric portion 224A relieves stress on the via plug 294 and the wide line 240. The first slot dielectric portion 224A is positioned as described above.

The first slot dielectric portion 224A defines a first slot in the wide line 240.

The embodiments slots in wide lines serve a different purpose that slot formed in line to reduce dishing from chemical-mechanical polish (CMP) processes and slot formed to modify the line resistance. The embodiment's slots are sized and positioned to reduce stress. In embodiments, the only slots in the wide lines are slots position near the via plug that reduce stress.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

In the above description numerous specific details are set forth such as widths, thicknesses, etc., in order to provide a more thorough understanding of the example embodiments of the present invention. It will be obvious, however, to one skilled in the art that the present invention may be practiced without these details. In other instances, well known process have not been described in detail in order to not unnecessarily obscure the present invention.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating an interconnection comprising:
   providing a substrate prepared with a dielectric layer; and
   forming a continuous conductive line in the dielectric layer comprising
      patterning the dielectric layer to form a trench in the dielectric layer corresponding to the continuous conductive line, wherein the patterning forms within the trench with at least one dielectric structure positioned in a portion of the trench that is proximal to the continuous conductive line having a via plug in communication therewith, and
      filling the trench with a conductive material that surrounds the at least one dielectric structure to form the continuous conductive line having at least one dielectric structure therein, wherein the dielectric structure creates a partial discontinuity within the continuous conductive line.

2. The method of claim 1 wherein the dielectric structure is of a sufficient dimension to reduce stress related defects in the continuous conductive line and the via plug in a via level which is in communication with the continuous conductive line in proximity of the dielectric structure.

3. The method of claim 1 wherein:
   the dielectric structure is of a sufficient size to reduce stress related defects in the continuous conductive line and the via plug in a via level in communication with the continuous conductive line in proximity of the dielectric structure; and
   the conductive material comprises copper.

4. The method of claim 1 wherein the patterning the dielectric layer to form the trench includes a plurality of dielectric structures in the continuous conductive line, the dielectric structures are of sufficient size to reduce stress related defects in the continuous conductive line and the via plug in communication with the continuous conductive line in proximity of the dielectric structures.

5. The method of claim 4 wherein:
   the via plug is located on a bottom surface or a top surface of the continuous conductive line; and
   the continuous conductive line containing the dielectric structures comprises a wide conductive line and the via plug is in communication with a narrow conductive line.

6. The method of claim 4 wherein the dielectric structures are completely within the trench such that the dielectric structures form dielectric islands within the continuous conductive line.

7. The method of claim 1 wherein:
   the patterning the dielectric layer to form the trench includes a plurality of dielectric structures in the continuous conductive line, the dielectric structures are of sufficient size to reduce stress related defects in the continuous conductive line and the via plug in communication with the continuous conductive line in proximity of the dielectric structures; and
   the conductive material comprises copper.

8. The method of claim 7 wherein:
   the via plug is located on a bottom surface or a top surface of the continuous conductive line; and
   the continuous conductive line containing the dielectric structures comprises a wide conductive line and the via plug is in communication with a narrow conductive line.

9. The method of claim 2 wherein said dielectric structures comprises a geometric shape including rectangular shape, L-shape, curve shape or a combination thereof.

10. A method of fabricating an interconnection comprising:
    providing a substrate prepared with a dielectric layer; and
    forming a continuous conductive line in the dielectric layer comprising
       patterning the dielectric layer to form a trench in the dielectric layer corresponding to the continuous conductive line, wherein the patterning forms within the trench with at least one dielectric structure positioned in a portion of the trench, and
       filling the trench with a conductive material that surrounds the at least one dielectric structure to form the continuous conductive line having the at least one dielectric structure therein, wherein the dielectric structure creates a partial discontinuity within the continuous conductive line, the dielectric structure is disposed within a distance from a via plug in a via level which is in communication with the continuous conductive line.

11. The method of claim 10 wherein a minimum distance away from the via plug is between about 0.05 µm and 0.12 µm and a maximum distance between the dielectric structure and the via plug is between about 0.855 and 1.205 µm.

12. The method of claim 10 wherein the dielectric structure is of a sufficient size to reduce stress related defects in the continuous conductive line and the via plug.

13. The method of claim 12 wherein the dielectric structure comprises:
    a width between about 135 and 315% of an effective diameter of the via plug; and
    a total length between about 265 and 1380% of the effective diameter of the via plug.

14. The method of claim 10 wherein patterning the dielectric layer to form the trench includes a plurality of dielectric structures in the continuous conductive line discontinuously surround the via plug.

15. The method of claim 14 wherein the dielectric structures form a plurality of geometrically discontinuous concentric rows of structures in the continuous conductive line around the via plug.

16. The method of claim 15 wherein:
    a minimum distance between the dielectric structures and the via plug is about 26 and 63% of an effective diameter/width of the via plug; and
    a maximum distance between the dielectric structures and the via plug is between 0.855 and 2.055 µm.

17. A method of fabricating an integrated circuit comprising:
    providing a substrate prepared with a dielectric layer;
    patterning the dielectric layer to form a trench in the dielectric layer corresponding to a continuous conductive line, wherein the trench includes a dielectric structure within the trench; and
    filling the trench with conductive material that surrounds the dielectric structure to form the continuous conductive line, wherein the continuous conductive line contains the dielectric structure therein, the dielectric structure creates a partial discontinuity within the continuous conductive line, wherein the dielectric structure is positioned in a portion of the trench that is proximal to the conductive line which has a via plug in communication therewith.

18. A method of fabricating a device comprising:
providing a substrate prepared with a dielectric layer corresponding to an interconnect level of the device; and
forming a continuous conductive line in the interconnect level of the dielectric layer, wherein the continuous conductive line surrounds a dielectric structure within the continuous conductive line, the dielectric structure partially interrupt the continuous conductive line, wherein the dielectric structure is positioned in a portion of the conductive line which has a via plug in communication therewith.

* * * * *